United States Patent [19]

Iwanami

[11] 4,400,797

[45] Aug. 23, 1983

[54] READ ONLY MEMORY USING STATIC INDUCTION TRANSISTOR

[75] Inventor: Eiichi Iwanami, Tokyo, Japan

[73] Assignee: Kabushiki Kaisha Daini Seikosha, Tokyo, Japan

[21] Appl. No.: 210,316

[22] Filed: Nov. 25, 1980

[30] Foreign Application Priority Data

Dec. 6, 1979 [JP] Japan .................. 54/158407

[51] Int. Cl.³ ............................................. G11C 11/40
[52] U.S. Cl. ............................... 365/174; 365/180; 357/22
[58] Field of Search ................... 365/174, 180; 357/22

[56] References Cited

U.S. PATENT DOCUMENTS

3,986,180 10/1976 Cade ............................. 357/23 X

OTHER PUBLICATIONS

"High Speed and High Density Static Induction Transistor Memory", by Nishizawa et al., *IEEE Journal of Solid-State Circuits*, vol. SC-13, No. 5, Oct. 1978, pp. 622-634.

*Primary Examiner*—Terrell W. Fears

*Attorney, Agent, or Firm*—Robert E. Burns; Emmanuel J. Lobato; Bruce L. Adams

[57] ABSTRACT

A read only memory comprised of a semiconductor substrate and an epitaxial semiconductor layer formed on the substrate and having the same conductivity type as the substrate and a lower impurity density than the substrate. A plurality of word lines are formed in the surface of the epitaxial layer and comprise regions of semiconductor material having a conductivity type opposite that of the substrate. The word lines have openings therethrough which are filled with the epitaxial layer material. Regions of semiconductor material having the same conductivity type as the substrate are formed in selected portions of the epitaxial layer material filling the openings through the word lines. A plurality of bit lines overlie and intersect the word lines and contact the regions of semiconductor material formed in the selected portions of the epitaxial layer material filling the openings of the word lines. The substrate, one of the word lines, the epitaxial layer material within the opening extending through the word line and the region of semiconductor material in the epitaxial layer material within the opening respectively comprise a source, gate, channel and drain of a static induction transistor.

12 Claims, 15 Drawing Figures

READ ONLY MEMORY USING STATIC INDUCTION TRANSISTOR

BACKGROUND OF THE INVENTION

This invention relates to a new construction of a read only memory (referred to as ROM) which is constructed by use of a static induction transistor (referred to as SIT) and can realize a high packing density.

Recently, a static induction transistor logic device (referred to as SITL) has been proposed as a logic element which operates with low power dissipation and has a wide frequency range. The operations of the SITL and the SIT will be described in conjunction with FIGS. 1 and 2. FIG. 1(a) illustrates a sectional view of a SITL device. In FIG. 1(a), reference 5 is a N+ substrate which acts as a base electrode of a PNP transistor and a source of a SIT, 6 is a N− epitaxial layer which has a surface impurity density of less than $1 \times 10^{14}$[atoms/cm$^3$] and acts as a base of the PNP transistor and a channel of the SIT, 7 is a P+ region which acts as an emitter of the PNP transistor, 8 is a P+ region which acts as a collector of the PNP transistor and a gate of the SIT, 9 is a N+ region acting as a drain of the SIT, 10 is an insulation layer such as SiO$_2$, 1 is an injector electrode, 2 is a gate electrode, 3 is a source electrode and 4 is the drain electrode. FIG. 1(b) is a equivalent circuit diagram of the SITL comprised of a PNP transistor T$_1$ and a SITT$_2$.

An injector voltage of more than 0.4 volts is normally applied to the injector electrode of the SITL. As a result, a collector current of the PNP transistor T$_1$ flows out a previous stage through a gate electrode 2 when the gate electrode 2 is at ground level. At this time, as shown by line a of FIG. 2(a), a potential barrier for electrons moving from the source 3 to the drain 4 is high in the adjacent portion enclosed with the gate 8, and there are extremely few electrons moving from the source 5 to the drain 9 even if the voltage is impressed to the drain electrode 4 as shown by the curve b. Therefore, the SITT$_2$ is turned off so that the level of the drain electrode 4 is closed to an injector voltage due to the load of the subsequent stage. On the other hand, since the collector current of the PNP transistor T$_1$ flows into the gate 8 of the SITT$_2$ when the previous stage of the SITL is turned off, the voltage potential at the gate 8 is increased to close the injector voltage. At this time, since the above mentioned potential barrier becomes low as shown by the curve a in FIG. 2B, large amounts of electrons are moved from the source 5 to the drain 9. Considering the above discription, it will be understood that the drain current of the SIT exponentially changes in accordance with the gate voltage. FIG. 3 illustrates a drain-source voltage to drain-source current characteristic for a SIT. From FIG. 3, it is understood that the drain-source current exponentially changes in accordance with the gate voltage.

In such a SITL, a few fJ can be attained in the electric characteristic and the power delay product; and it is recognized that such a SITL is an excellent circuit element. However, a SIT ROM which is able to enlarge its application has not been presented yet so that the SITL has not come into wide use for the present.

SUMMARY OF THE INVENTION

An object of the present invention is to provide a new high speed SIT ROM which operates in the SIT mode and can be fabricated in a high density integrated circuit.

A SIT ROM of the present invention is arranged in such a way that gate P+ regions are used as word lines, and metal lines which intersect each of the word lines are in contact with N+ regions corresponding to drains and are used as bit lines. SITs are located at the portions where the word lines intersect the bit lines, and the recording of data is carried out in accordance with whether or not the bit lines are in contact with the drains of SITs.

DETAILED DESCRIPTION OF THE DRAWINGS

The present invention will be explained in conjunction with the attached drawings.

Figure 1A:
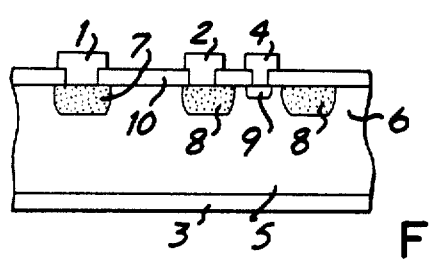
FIGS. 1A and 1B are illustrative views for explaining the structure of the SITL.
Figure 1B:
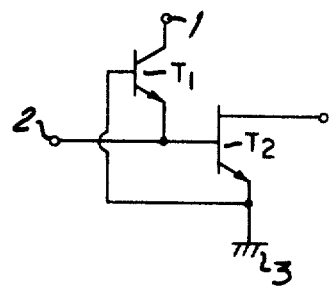
Figure 2A:
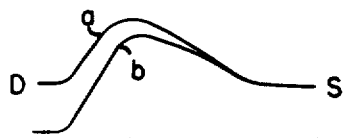
FIGS. 2A and 2B are illustrative views for explaining the operation of the SIT.
Figure 2B:
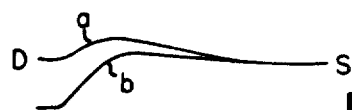
Figure 3:
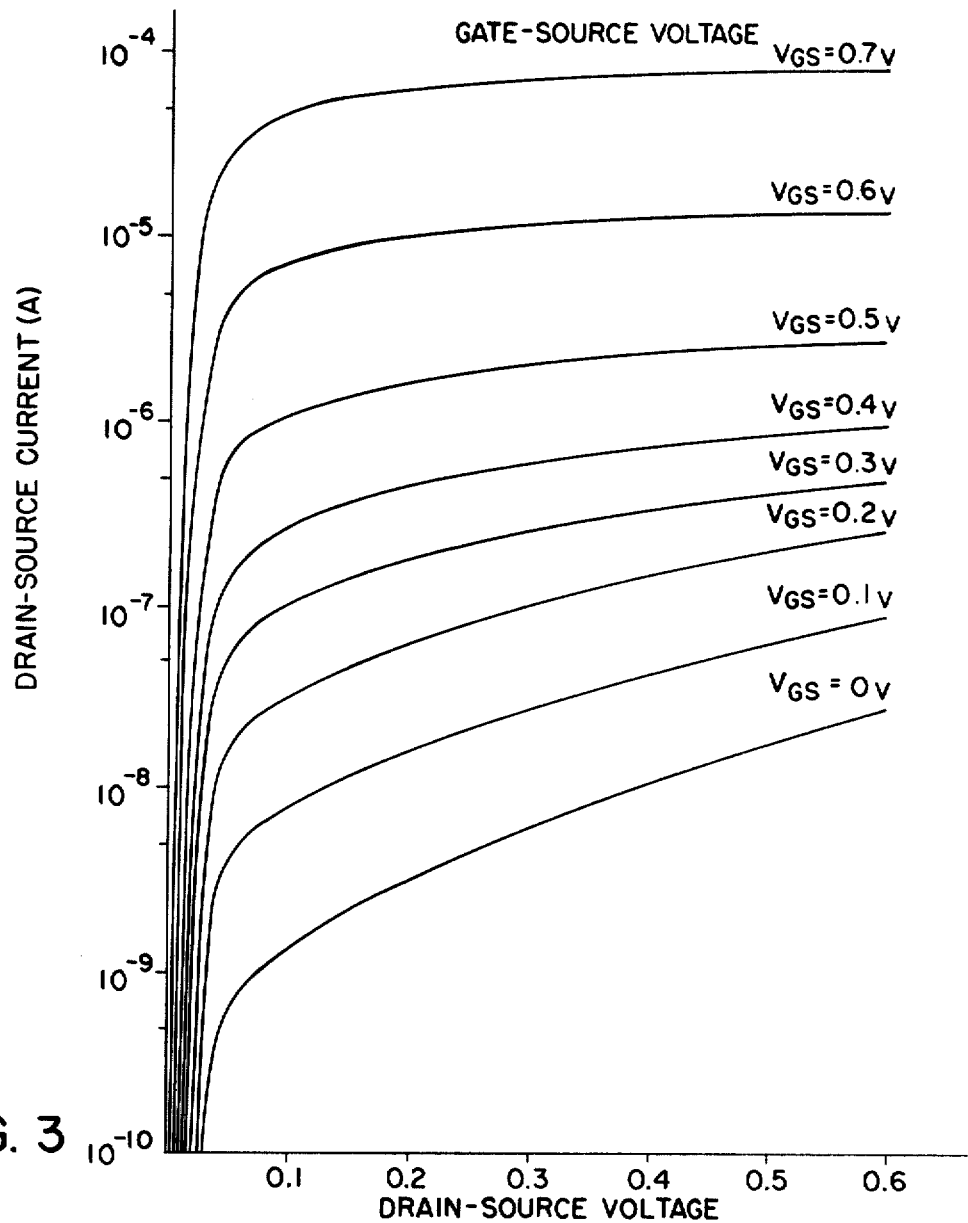
FIG. 3 is a graph of the static characteristic of the SIT.
Figure 4A:
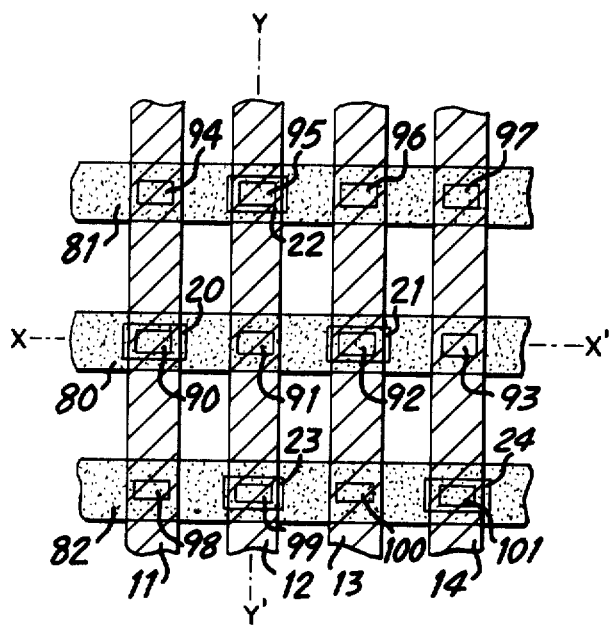
FIGS. 4A to 4D are a plan view, an equivalent circuit diagram and sectional views of an embodiment of the invention, respectively.
Figure 4B:
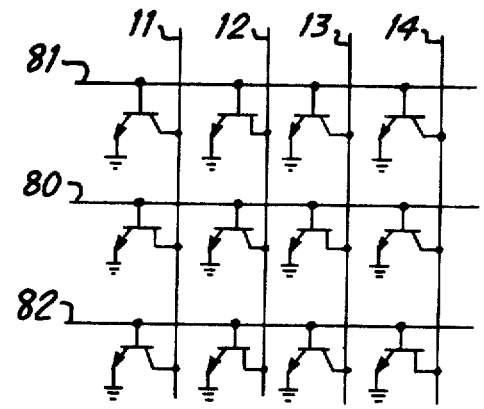
Figure 4C:
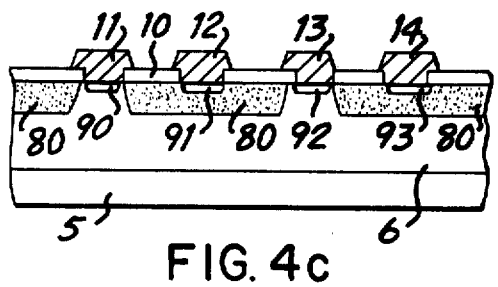
Figure 4D:
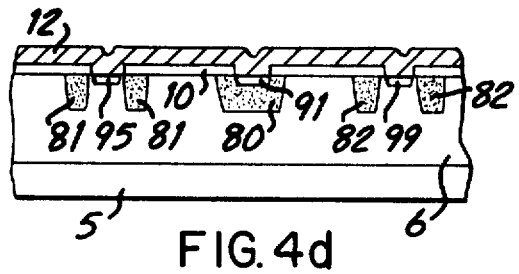

In FIG. 4A to FIG. 4D, a first embodiment of the structure of the SIT ROM of the present invention is illustrated. FIG. 4A is a plan view of the SIT ROM, FIG. 4B is an equivalent circuit, FIG. 4C is a sectional view taken on line X—X', and FIG. 4D is a sectional view taken on line Y—Y'. References 80, 81 and 82 are word lines formed by P+ regions, in which gate spaces 20, 21, 22, 23 and 24 are formed, and these spaces are apertures formed in the P+ regions enclosing N+ regions which act as drains 90, 92, 95, 99 and 101 of SITs. References 91, 93, 94, 96, 97, 98 and 100 are collectors of vertical NPN bi-polar transistors which are formed at the same time as the N+ regions which act as drains 90, 92, 95, 99 and 101 of the SITs are formed. References 11, 12, 13 and 14 are bit lines which are made of aluminum, low registance polysilicon or the like and are respectively in contact with the drains and collectors. Other reference numerals correspond to the reference numerals used in FIG. 1A. In FIG. 4B, there are SITs at the portions of gate spaces 20, 21, 22, 23 and 24. Now, the essential operation of the SIT ROM of the present invention will be described. When only the word line 80 is selected and its level becomes high, since the SITT$_3$ which has the gate being the P+ region of the word line 80, the drain 90 and the source being the N+ substrate, is turned on as described above, and the potential of the bit line 11 becomes low. On the other hand, the potential of the bit line 12 becomes high due to the high impedance of the collector of a vertical NPN bi-polar transistor which has the base being P+ region, the collector 91 and the emitter being the N+ substrate 5 and the epitaxial layer 6.

The vertical NPN bi-polar transistor T$_4$ will be explained in more detail. As described above, the vertical NPN bi-polar transistor $T_4$ as well as an IIL (Integrated Injection Logic) is a reverse transistor, and the substrate 5 is used as emitter. Furthermore, the impurity density of the epitaxial layer 6 is less than $1 \times 10^{14}$ atoms/cm$^3$ and that of the word line 80 which is a P+ region and acts as a base is more than $5 \times 10^{18}$ atoms/cm$^3$. However, in the normal condition, the impurity density of the word line 80 is approximately $5 \times 10^{19}$ atoms/cm$^3$. Therefore, (hole current is superior in the current flowing through the junction, when the base to emitter junction is biased in the forward direction) that is, the word line 80 is selected. As a result, the emitter efficiency is extremely low using as the bi-polar transistor. As described above, since the base is formed by the use of the P+ region, the recombination rate of electron is high and the transport factor in the base region is extremely low. Therefore, the common-emitter forward current gain is sufficiently smaller than one. Therefore, regardless of the selecting condition of the word line 80, the collector 91 is always opened so that the voltage potential of the bit line 11 is not affected at all.

On the other hand, when the word line 80 is not selected to be low level, the resistance between the drain 90 of the SITT$_3$ and the N+ substrate 5 becomes high, as seen from the foregoing explanation, so that the level of the bit line 11 becomes high.

Although loads for the bit lines 11, 12, 13 and 14 are not illustrated, in the SIT ROM of the present invention, it is possible to incorporate the loads into the SIT ROM as lateral PNP bi-polar transistors which are formed by utilizing the P+ region formed at a same time of as the forming of the word lines 80, 81 and 82.

Figure 5:
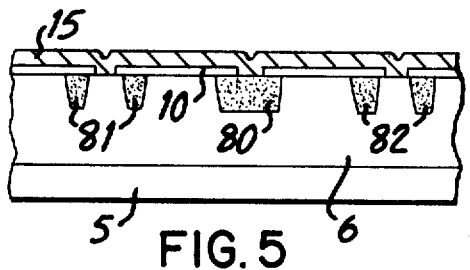
FIG. 5 is a sectional view of another embodiment of the invention.

FIG. 5 illustrates a second embodiment of the present invention, wherein the N+ region which acts as the drain of the SIT and the collector of the NPN transistor is omitted therefrom. And then, N type low resistance polysilicon 15 is used as the drains, and the bit lines are used as the collectors in common. This embodiment is advantageous in that a potential barrier for electrons, which barrier is formed by the word lines 81 and 82 operating as the gates of SIT, can be formed under the shallow junction of the word lines 81 and 82, since there is no effect of the drain potential, and the common-emitter forward current gain becomes smaller that that in the embodiment shown in FIGS. 4A to 4D as described above.

In the described-above embodiment, the data recording operation can be carried out by the use of only the one mask.

Figure 6A:
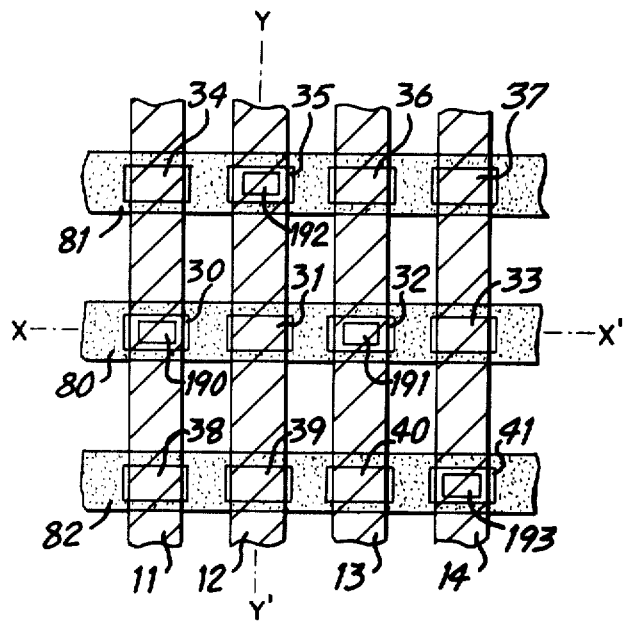
FIG. 6A to 6D are a plan view, an equivalent circuit diagram and sectional views of another embodiment of the invention.
Figure 6B:
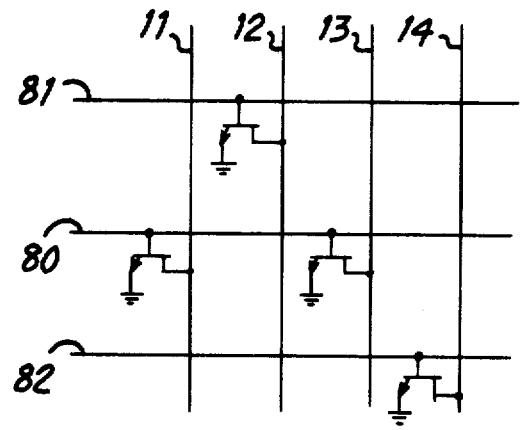
Figure 6C:
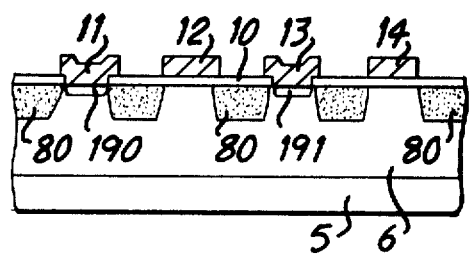
Figure 6D:
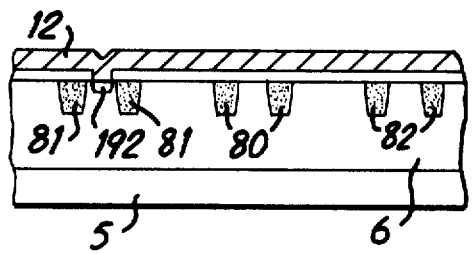

In FIGS. 6A to 6D, a third embodiment of the present invention is illustrated. FIG. 6A is a plan view thereof, FIG. 6B is an equivalent circuit diagram, FIG. 6C is a sectional view taken on line X—X', and FIG. 6D is a sectional view taken on line Y—Y'. References 80, 81 and 82 are word lines of P+, and gate spaces 30, 31, 32, 33, 34, 35, 36, 37, 38, 39, 40 and 41 each for a SIT are formed therein. Reference 190, 191, 192 and 193 are SIT drains and are N+. These drains are formed at positions which determine the data of the ROM by making windows in the insulation layer 10 so as to correspond to the gate spaces 30, 32, 35 and 41. References 11, 12, 13 and 14 are bit lines which are made of aluminum, low resistance polysilicon or the like and are respectively in contact with the drains 190, 191, 192 and 193. Other reference numerals correspond to the reference numerals used in FIG. 1A. The semiconductor surface of the gate spaces 31, 33, 36, 37, 38, 39 and 40 on which the drains 190, 191, 192 and 193 are not formed, is coated with the insulation layer 10.

Therefore, in the third embodiment, SITs are formed at the intersections between the word line 80 and the bit line 11, the word line 80 and the bit line 13, the word line 81 and the bit line 12, and the word line 82 and the bit line 14, as shown in the equivalent circuit of FIG. 6B. In FIG. 4A and FIG. 6A, although the the distances among the word lines 80, 81 and 82 depend on the impurity density of the epitaxial layer 6, the value of the distance is not a serious problem if it is not under a strong punch through state. The spaces among the bit lines 11, 12 and 13 are determined by the lithography technique.

Next, the essential operation of the SIT ROM of this embodiment will be described. When the word line 80 is selected and its level becomes high, since the SIT which has the gate comprised of the P+ region of the word line 80, the drain 190 of N+ and the source being the N+ substrate 5, is turned on as described above, the potential of the bit line 11 becomes low. On the other hand, since the SIT is not formed in the corresponding word line 80 but the insulation layer 10 is formed under the bit line 12, the bit line 12 is not effected electrically so that the level of the bit line 12 becomes high.

Although loads for the bit lines 11, 12, 13 and 14 are not illustrated, as with the previous embodiment, it is possible to incorporate the loads into the SIT ROM as lateral PNP bi-polar transistors which are formed by utilizing the P+ region formed at the same time as the forming of the word lines 80, 81 and 82.

Figure 7:
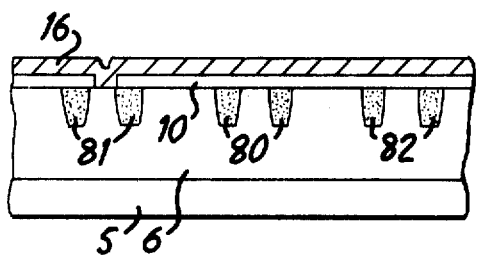
FIG. 7 is a sectional view of another embodiment of the invention.

FIG. 7 is a sectional view of a fourth embodiment of the present invention taken along the bit line. The N+ region shown in the previous embodiment as the drain of the SIT is not formed. The bit line 16 is formed by the use of N+ doped low resistance polysilicon, and the bit line 16 is used as the drain of the SIT in common by defining the window in the insulation layer 10 on the gate space where the SIT is located as the data stored in the ROM. The SIT ROM of the present invention can be easily fabricated by the conventional technique without adding any additional processes to the conventional SITL fabricating process.

In the SIT ROM according to the present invention, if the data recording transistor is the SIT, the structure of the transistor is out of question. Therefore, a transistor in which the word line is formed in any concave portion, such as V-shaped or U-shaped concave, can be used.

It is also possible to use the opposite conductivity type transistor.

The SIT ROM according to the present invention is advantageous in that the external circuits, such as a multiplexer, can be simplified in structure since the load capacitor of the bit line is small due to the metal bit line, and the high speed operation and the high density integration in the SIT are realized since the bulk transmission is in the perpendicular direction to the major surface of the semiconductor. Therefore, the present invention contributes to the development of integrated electronic devices.

What is claimed:
1. A read only memory using static induction transistors, comprising:
a semiconductor substrate having one conductivity type;
an epitaxial semiconductor layer formed on a major surface of said semiconductor substrate and having the same conductivity type as that of semiconductor substrate and a lower impurity density than that of said semiconductor substrate;

a plurality of word lines formed in a surface portion of said epitaxial layer and comprising regions of semiconductor material having a conductivity type opposite that of said semiconductor substrate, said word lines having openings therethrough extending down to said epitaxial layer and filled with epitaxial layer material;

regions of semiconductor material having the same conductivity type as that of said semiconductor substrate formed in selected portions of the epitaxial layer material filling the openings through said word lines;

a plurality of bit lines overlying and intersecting said word lines and contacting at said regions of semiconductor material formed in said selected portions of the epitaxial layer material filling the openings through said word lines; wherein said substrate, one of said word lines, the epitaxial layer material within the opening extending through said one word line and said region of semiconductor material in the epitaxial layer material within the opening extending through said one word line respectively comprise a source, gate, channel and drain of a static induction transistor.

2. A read only memory using static induction transistors according to claim 1, wherein said bit lines are metal lines.

3. A read only memory using static induction transistors according to claim 1, wherein said bit lines are low resistance polysilicon lines.

4. A read only memory using static induction transistors according to claim 1, wherein said epitaxial layer has an impurity atom density less than about $1 \times 10^{14}$ atoms/cm$^3$.

5. A read only memory using static induction transistors according to claim 1, wherein said word lines have an impurity atom density greater than about $5 \times 10^{18}$ atoms/cm$^3$.

6. A read only memory using static induction transistors according to claim 5, wherein said word lines have an impurity atom density greater than about $5 \times 10^{19}$ atoms/cm$^3$.

7. A read only memory comprising:

a semiconductor substrate having one conductivity type and a major surface;

an epitaxial semiconductor layer formed on the major surface of said semiconductor substrate and having the same conductivity type as that of said semiconductor substrate and a lower impurity density than that of said semiconductor substrate;

a plurality of word lines formed in a surface portion of said epitaxial layer and comprising regions of semiconductor material having a conductivity type opposite to that of said semiconductor substrate, said word lines being disposed generally parallel in a regular array and each having a plurality of openings therethrough extending down to said epitaxial layer and filled with epitaxial layer material, wherein the openings through said word lines are regularly spaced along the lengths of said word lines and are positioned opposite each other so as to be relatively disposed in a regular matrix of locations;

regions of semiconductor material having the same conductivity type as that of said semiconductor substrate formed within selected openings through said word lines at the epitaxial layer surface and within the epitaxial layer material filling the selected openings, wherein each region of semiconductor material formed in the selected opening is a static induction transistor drain, the epitaxial layer material in which said region of semiconductor material is formed is the channel of the static induction transistor, the portion of the word line surrounding the opening filled with the epitaxial layer material is the gate of the static induction transistor, and said substrate is the source of said static induction transistor; and a plurality of bit lines disposed regularly spaced overlying and intersecting said word lines and contacting said regions of semiconductor material comprising the drains of the respective static induction transistors, wherein the memory content of the read only memory is determined by at which of the openings through said word lines a static induction is formed, and the read only memory is read out by electrically biasing said word lines to render the static induction transistors conductive and change the potentials of the bit lines according to the memory content of the read only memory.

8. A read only memory according to claim 7, wherein said bit lines are metal lines.

9. A read only memory according to claim 7, wherein said bit lines are low resistance polysilicon lines.

10. A read only memory according to claim 7, wherein said epitaxial layer has an impurity atom density less than about $1 \times 10^{14}$ atoms/cm$^3$.

11. A read only memory according to claim 7, wherein said word lines have an impurity atom density greater than about $5 \times 10^{18}$ atoms/cm$^3$.

12. A read only memory according to claim 11, wherein said word lines have an impurity atom density greater than about $5 \times 10^{19}$ atoms/cm$^3$.

* * * * *